(12) United States Patent
Chu et al.

(10) Patent No.: US 6,815,814 B2
(45) Date of Patent: Nov. 9, 2004

(54) THERMOELECTRIC MODULE

(75) Inventors: Rencai Chu, Atsugi (JP); Kanichi Kadotani, Atsugi (JP); Toshinobu Tanimura, Hiratsuka (JP)

(73) Assignee: Komatsu Ltd., Tokyo (JP)

( * ) Notice: Subject to any disclaimer, the term of this patent is extended or adjusted under 35 U.S.C. 154(b) by 0 days.

(21) Appl. No.: 10/265,761

(22) Filed: Oct. 8, 2002

(65) Prior Publication Data

US 2003/0102554 A1 Jun. 5, 2003

(30) Foreign Application Priority Data

Oct. 11, 2001 (JP) ........................................ 2001-314168

(51) Int. Cl.$^7$ ............................................. H01L 23/34
(52) U.S. Cl. ........................ 257/722; 257/706; 257/723; 257/713; 361/703
(58) Field of Search .................................. 257/722, 706, 257/723, 713; 361/709, 717, 716, 673, 701–704, 697

(56) References Cited

U.S. PATENT DOCUMENTS

| | | | | |
|---|---|---|---|---|
| 5,255,520 A | * | 10/1993 | O'Geary et al. | 62/3.2 |
| 5,637,921 A | * | 6/1997 | Burward-Hoy | |
| 6,002,081 A | * | 12/1999 | Sakuragi | 136/203 |
| 6,271,459 B1 | * | 8/2001 | Yoo | 136/201 |
| 6,385,976 B1 | * | 5/2002 | Yamamura et al. | 62/3.7 |
| 6,539,725 B2 | * | 4/2003 | Bell | 62/3.7 |
| 2003/0066554 A1 | * | 4/2003 | Feher | 136/200 |

FOREIGN PATENT DOCUMENTS

| | | | |
|---|---|---|---|
| JP | 03091272 | 4/1991 | |
| JP | 4-162553 | * 6/1992 | ................ 257/721 |
| JP | 05003051 | 1/1993 | |
| JP | 06216413 | 8/1994 | |

OTHER PUBLICATIONS

Optimization of Heat Sink Design and Fan Selection in Portable Electronics Environment. six pages.*

* cited by examiner

*Primary Examiner*—Jasmine Clark
(74) *Attorney, Agent, or Firm*—Varndell & Varndell, PLLC

(57) ABSTRACT

An objective of the present invention is to provide a thermoelectric module which can achieve high heat release and heat absorption efficiencies and which can obviate any thermal stress-caused damages. A thermoelectric module (1) in an embodiment has a predetermined number of thermoelectric semiconductor elements P and N which are arranged in a flat plate configuration. Each of the thermoelectric semiconductor elements P and N has on one face thereof a one-side electrode (2) and has on the other face thereof an other-side electrode (3), thereby allowing all of the thermoelectric semiconductor elements P and N to be connected in series. The one-side electrodes (2, 2 . . . ) have heat release/heat absorption fins (heat transfer fins) (2F, 2F . . . ) and the other-side electrodes (3, 3 . . . ) have heat release/heat absorption fins (heat transfer fins) (3F, 3F . . . ).

5 Claims, 6 Drawing Sheets

— EFFECT OF HEAT TRANSFER AREA EXPANSION + EFFECT OF SURFACE TENSION
—·— EFFECT OF HEAT TRANSFER AREA EXPANSION

THERMOELECTRIC MODULE

BACKGROUND OF THE INVENTION

1. Field of the Invention

The present invention relates to a thermoelectric module in which a predetermined number of thermoelectric semiconductor elements are arranged in a flat plate configuration, each of the thermoelectric semiconductor elements has on one face thereof a one-side electrodes and has on the other face thereof an other-side electrodes, and all of the thermoelectric semiconductor elements are connected in series.

2. Description of the Related Art

A conventional thermoelectric apparatus A shown in FIG. 8 is configured by allowing both faces of a thermoelectric module M (a heat absorption face and a heat release face) to have heat sinks F having fins.

The thermoelectric module M is configured such that a predetermined number of thermoelectric semiconductor elements (P-type elements and N-type elements) P and N are arranged in a flat plate configuration to allow these thermoelectric semiconductor elements P and N to have on one face (an upper face in FIG. 8) one-side electrodes Ta, Ta . . . and to have on the other face (a lower face in FIG. 8) other-side electrodes Tb, Tb . . . , thereby allowing all of the thermoelectric semiconductor elements P and N to be connected in series.

On the other hand, the heat sinks F having fins are provided for the purpose of increasing the heat absorption and release efficiencies of the thermoelectric module M, and are generally formed of a metal material having a high thermal conductivity such as aluminum or the like.

The pair of heat sinks F, F is attached to a predetermined position such that bolts B, B are used to fasten the pair of heat sinks F, F to each other with the thermoelectric module M being sandwiched by the pair of heat sinks F, F.

Furthermore, insulators G formed of ceramic or the like for an electrical insulation purpose are interposed between the one-side electrodes Ta at the thermoelectric module M and the heat sink F formed of a metal material as described above and between the other-side electrodes Tb at the thermoelectric module M and the heat sink F, respectively.

In the above-described conventional thermoelectric apparatus A, the insulator G is provided between the thermoelectric module M and each of the heat sinks F. This caused an inconvenience in that the thermoelectric module M and each of the heat sinks F have therebetween an increased thermal resistance, resulting in a decrease in the heat release and heat absorption efficiencies of the thermoelectric module M.

One of the conceivable configurations for eliminating the above-described inconvenience is the one in which each heat sink F is formed of non-electrically-conductive material such as resin to eliminate the need for the insulator G. Such a configuration, however, has a difficulty in eliminating the decrease in the heat release and heat absorption efficiencies of thermoelectric module M because non-electrically-conductive material has a higher thermal resistance than metal materials.

The above-described conventional thermoelectric apparatus A has, on the other hand, has other problems. One of the problems is that, during the operation of the thermoelectric apparatus A, the heat sink F attached to the heat absorption face and the heat sink F attached to the heat release face of the thermoelectric module M have a temperature difference to cause a thermal stress which affects the thermoelectric module M, resulting in a reduced life of the thermoelectric semiconductor elements P and N or a damaged thermoelectric module M or the like.

The present invention is made in view of the above and has an object of providing a thermoelectric module which can achieve high heat release and absorption efficiencies and which can obviate any damages caused by thermal stress.

SUMMARY OF THE INVENTION

A thermoelectric module according to the present inventions in which a predetermined number of thermoelectric semiconductor elements are arranged in a flat plate configuration, each of the thermoelectric semiconductor elements has on one face thereof one-side electrodes and has on the other face thereof other-side electrodes so that all of the thermoelectric semiconductor elements are connected in series, is characterized in that a least one of the one-side electrodes and the other-side electrodes are provided with heat transfer fins.

In a thermoelectric module according to the present invention, a predetermined number of thermoelectric semiconductor elements are arranged in a flat plate configuration, each of the thermoelectric semiconductor elements has on one face thereof a one-side electrodes and has on the other face thereof an other-side electrodes, and all of the thermoelectric semiconductor elements are connected in series, the thermoelectric module is characterized in that at least one of each electrode of the one-side electrodes or each electrode of the other-side electrodes has thereon heat transfer fins.

According to the above configuration, the direct provision of the heat transfer fins on one-side electrodes and other-side electrodes eliminates the need of an insulator that has been interposed between a heat sink having fins and a thermoelectric module in the conventional apparatus, thereby to eliminate a thermal resistance caused by such an insulator. Thus, the thermoelectric module according to the present invention can provide a remarkable increase in heat release and heat absorption efficiencies.

Further, according to the above configuration, the direct provision of the heat transfer fins on the one-side electrodes and the other-side electrodes also prevents a thermal stress which is caused in a conventional apparatus in which a thermoelectric module is sandwiched by a pair of heat sinks through bolts. Thus, the thermoelectric module according to the present invention also prevents unexpected thermal stress.

Therefore, the thermoelectric module according to the present invention can achieve high heat release and heat absorption efficiencies and can obviate any thermal stress-caused damages.

DESCRIPTION OF THE PREFERRED EMBODIMENTS

Hereinafter, embodiments of the present invention will be described in detail with reference to the drawings.

Figure 1A:
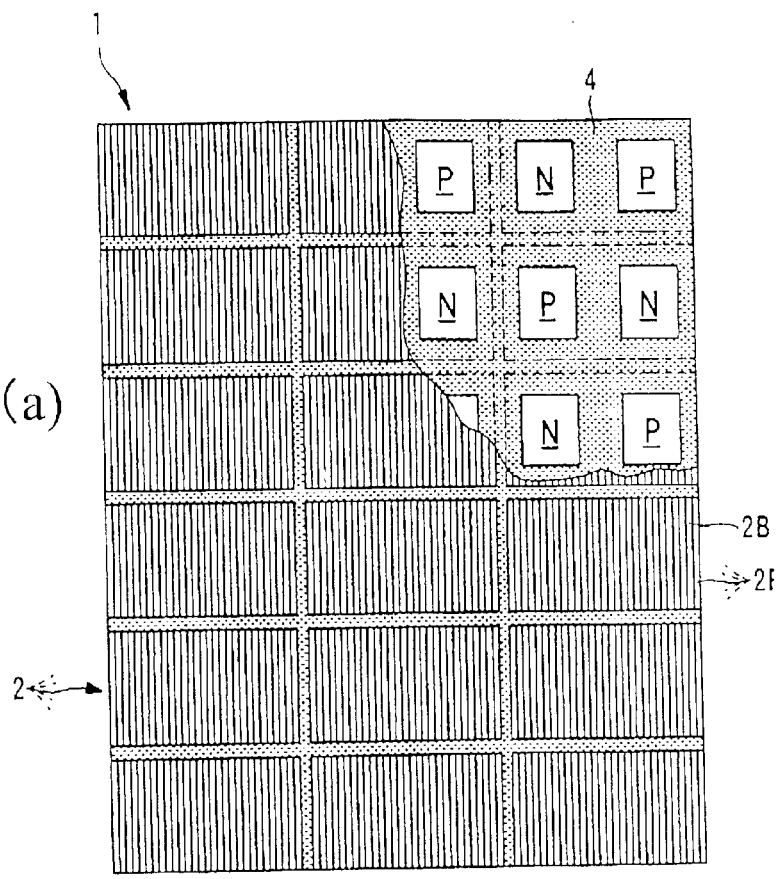
FIG. 1(a) is a total plan view illustrating an embodiment of a thermoelectric module according to the present invention.
Figure 1B:
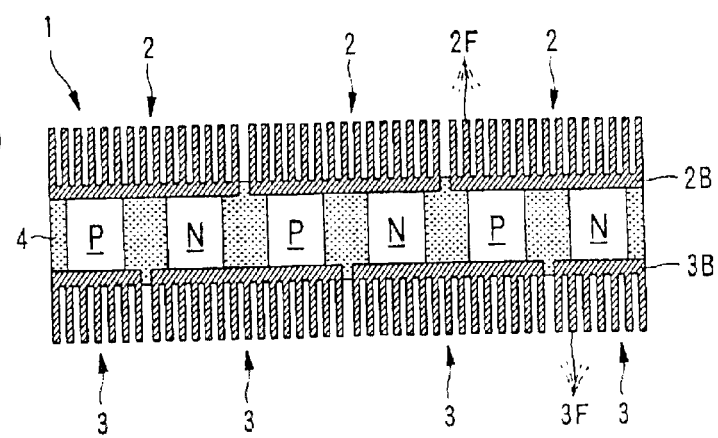
FIG. 1(b) is a cross-sectional side view illustrating the embodiment of the thermoelectric module according to the present invention.

FIGS. 1(a) and 1(b) illustrate an embodiment of a thermoelectric module according to the present invention. This thermoelectric module 1 is configured such that, a predetermined number of thermoelectric semiconductor elements (P-type elements and N-type elements) P and N are arranged in a flat plate configuration to allow these thermoelectric semiconductor elements P and N to have on one face (upper face in FIG. 1(a)) one-side electrodes 2, 2 . . . and to have on the other face (lower face in FIG. 1(b)) other-side electrodes 3, 3 . . . , thereby allowing all of the thermoelectric semiconductor elements P and N to be connected in series.

In this embodiment, the predetermined number of thermoelectric semiconductor elements P and thermoelectric semiconductor elements N are alternatively arranged to form a lattice pattern. Each of these thermoelectric semiconductor elements P and N is solder-connected to each electrode of the one-side electrodes 2 and the other-side electrodes 3. Furthermore, interspaces among the thermoelectric semiconductor elements P and N are filled with insulators 4 which are formed of a mold resin or a silicon sealant having low thermal conductivity.

As shown in FIGS. 1(a) and 1(b), the one-side electrodes 2 have a rectangular-shaped base section 2B connected to the thermoelectric semiconductor elements P and N; and a number of fins for heat release/heat absorption functions (heat transfer fins) 2F, 2F . . . which are provided on an outer face of the base section 2B (upper face of FIG. 1(b)). The base section 2B and each of the fins 2F, 2F . . . are formed in one united body by a metal material having good electrical conductivity and high thermal conductivity such as copper (Cu) or aluminum (Al).

As with the above-described one-side electrodes 2, the other-side electrodes 3 also have a rectangular-shaped base section 3B connected to the thermoelectric semiconductor elements P and N; and a number of fins for heat release/heat absorption functions (heat transfer fins) 3F, 3F . . . which are provided on an outer face of the base section 3B (lower face of FIG. 1(b)). The base section 3B and each of the fins 3F, 3F . . . are formed in one united body by a metal material having good electrical conductivity and high thermal conductivity such as copper (Cu) or aluminum (Al).

Figure 8:
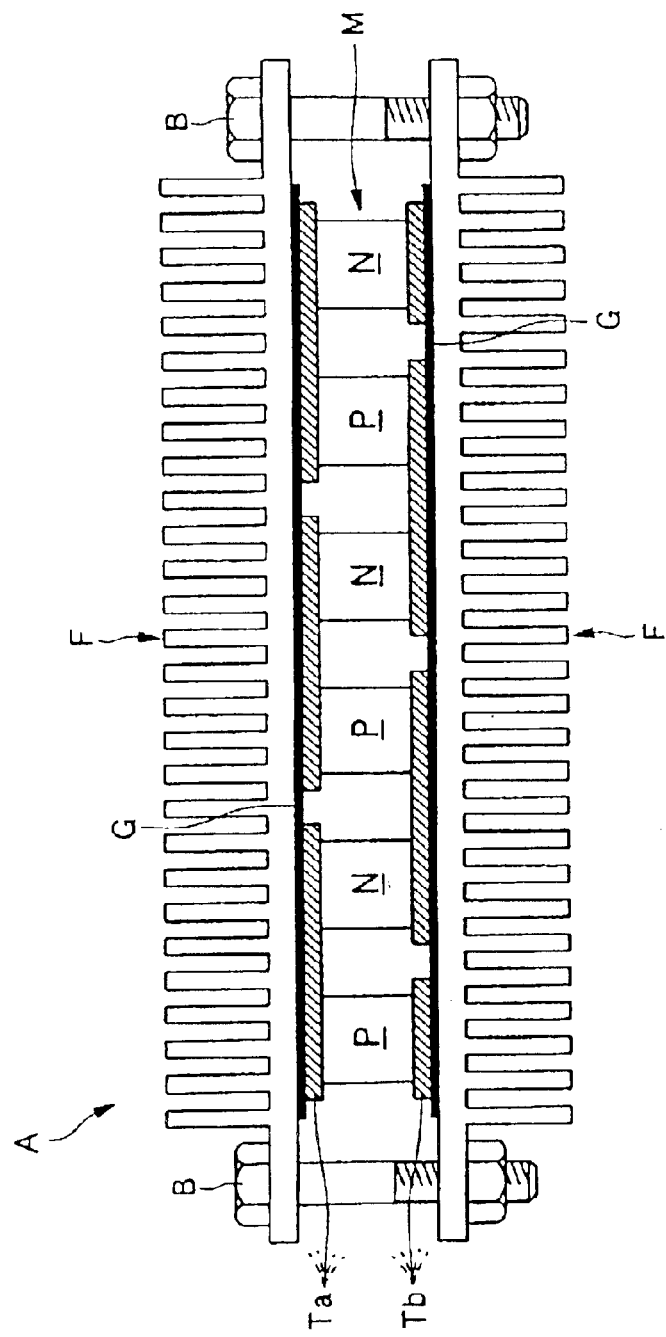
FIG. 8 is a side view illustrating a thermoelectric apparatus using a conventional thermoelectric module.

According to the thermoelectric module 1 having the above-described configuration, the fins 2F and the fins 3F are directly provided on the one-side electrodes 2 and the other-side electrodes 3. This direct provision of fins eliminates the thermal resistance caused by the insulator in the conventional apparatus (see FIG. 8) in which the insulator has been interposed between the heat sink having fins and the thermoelectric module, thereby to provides a remarkable increase in the heat release and heat absorption efficiencies in the thermoelectric module 1.

According to the thermoelectric module 1 having the above-described configuration, the one-side electrode 2 and the other-side electrodes 3 are formed of a metal material such as copper (Cu) or aluminum (Al) having good electric conductivity and high thermal conductivity (i.e., low thermal resistance). This also provides a further increase in the heat release and heat absorption efficiencies of the thermoelectric module 1.

According to the thermoelectric module 1 having the above-described configuration, the fins 2F and the fins 3F are directly provided on the one-side electrodes 2 and the other-side electrodes 3. Thus, unlike the configuration of the conventional apparatus (see FIG. 8) in which a thermoelectric module is sandwiched by a pair of heat sinks through bolts, the configuration according to this embodiment is free from the thermal stress generated in the conventional configuration. Specifically, the thermoelectric module 1 is not subjected to undesirable thermal stress during the operation, thereby allowing the thermoelectric module 1 to obviate any thermal stress-caused damages and to have an improved durability.

Further, since the heat sinks is not used as in the conventional apparatus (see FIG. 8), the thermoelectric module 1 has a very compact exterior and a simple structure, thereby enabling a very good manufacturability.

In addition, the one-side electrodes 2 and the other-side electrodes 3 of the above-described thermoelectric module 1 have the flat rectangular base section 2B and base section 3B on which the fins 2F and fins 3F are formed. This configuration provides the thermoelectric semiconductor elements P and N, and the one-side electrodes 2 and the other-side electrodes 3 with sufficient connection areas therebetween by the base section 2B and the base section 3B, thereby allowing the thermoelectric module 1 to have the equal structural reliability to that of the conventional thermoelectric modules.

In the above-described embodiment, the one-side electrodes 2 and the other-side electrodes 3 have fins which align with one another in the direction of the shorter edges of the electrodes and which stand with interspaces thereamong in the direction of the longer edges of the electrodes.

In the above-described embodiment, the fins provided on the one-side electrodes 2 and the other-side electrodes 3 generally have a thin flat plate configuration. However, it goes without saying that pin fins may also be used in place of these thin plate fins.

The fins 2F and the fins 3F formed on the one-side electrodes 2 and the other-side electrodes 3 provide an effect for expanding a heat transfer surface area against single-layer fluid such as liquid or gas, thereby apparently increasing the heat release and heat absorption efficiencies of the one-side electrodes 2 and the other-side electrodes 3.

However, it is noted that in designing the fins 2F and the fins 3F, fin sizes (height, thickness, configuration, etc.) should be determined by taking into consideration a fin efficiency.

Figure 2:
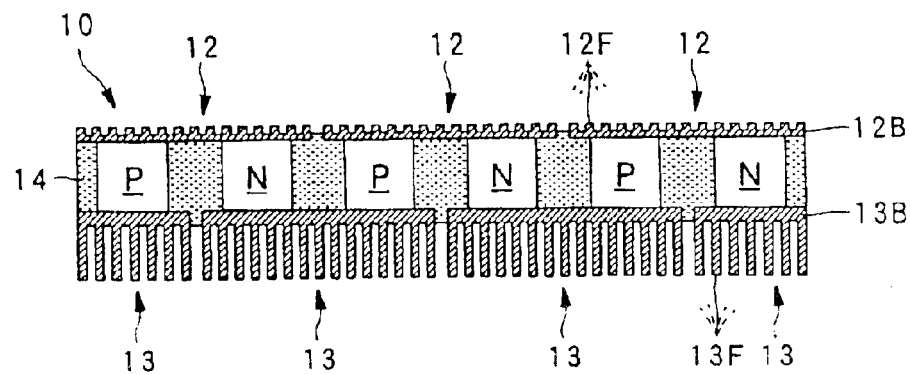
FIG. 2 is a cross-sectional side view illustrating another embodiment of the thermoelectric module according to the present invention.

FIG. 2 shows another embodiment of the thermoelectric module according to the present invention. This thermoelectric module 10 allows heat to release from a heat medium provided on the heat absorption-side through condensation.

A one-side electrode 12 has a rectangular-shaped base section 12B connected to the thermoelectric semiconductor elements P and N; and a multitude of low fins (heat transfer fins) 12F, 12F . . . provided on the outer face of the base section 12B (upper face in FIG. 2). The base section 12B and each of the low fins 12F, 12F . . . are formed in one united body with a metal material having good electrical conductivity and high thermal conductivity such as copper (Cu) or aluminum (Al).

The low fins 12F, 12F . . . have a structure which provides not only their original effect of expanding a heat transfer surface area but also an additional effect obtained from a surface tension of the heat medium, thus achieving a remarkable increase in a condensation heat transfer coefficient. The low fins 12F, 12F . . . generally have a configuration of a height of 5 mm or less and a pitch of 10 mm or less (space of 5 mm or less).

Figure 3:
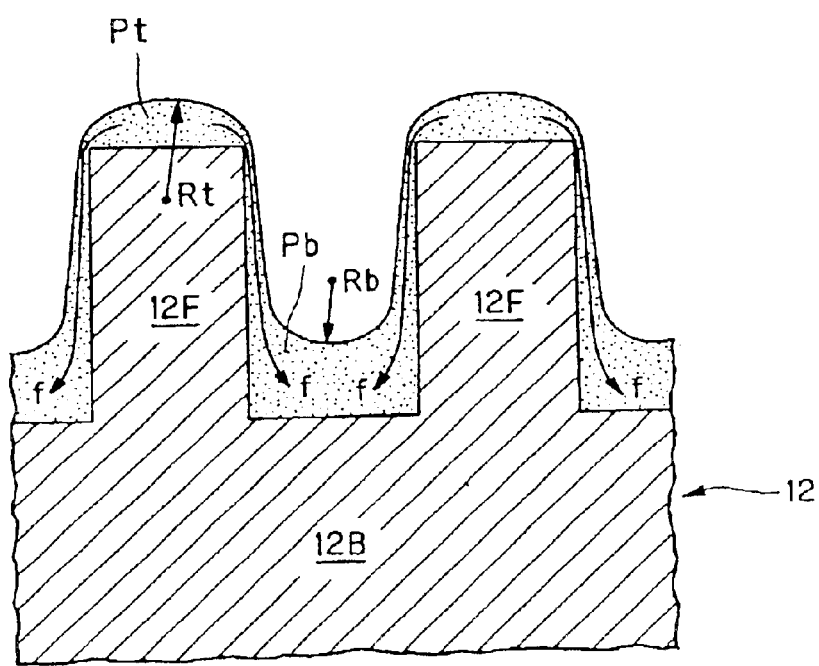
FIG. 3 is a principle diagram illustrating a mechanism by which heat of condensation is transferred by a surface tension effect by low fins.

A principle of how the surface tension of the heat medium accelerates the condensation heat transfer coefficient will now be described. As shown in FIG. 3, a pressure Pt in the interior of condensate having a convex liquid surface configuration at the top free end of the low fin 12F is higher than the atmospheric pressure as shown in the following formula (1), and a pressure Pb in the interior of condensate having a concave liquid surface configuration at the groove sections among the neighboring low fins 12F is lower than the atmospheric pressure as shown in the following formula (2). As a result, the difference between the pressure Pt and the pressure Pb as shown by the following formula (3) allows the condensate to be driven from the top free end of the low fins 12F to the groove sections among the neighboring low fins 12F in the direction of arrows f, f . . . , as shown the in FIG. 3. This results in a thinner condensate at the surface of the low fins 12F, thereby providing a higher condensation heat transfer coefficient.

$$Pt=Pa+(\sigma/Rt) \quad (1)$$

$$Pb=Pa-(\sigma/Rb) \quad (2)$$

$$\Delta P=Pt-Pb=\sigma[(1/Rt)+(1/Rb)] \quad (3)$$

In the above formulas, Rt is a radius of curvature of the condensate at the top free end of the low fins 12F, Rb is a radius of curvature of the condensate at the groove sections among the neighboring low fins 12F, and Pa is the atmospheric pressure.

Figure 4:
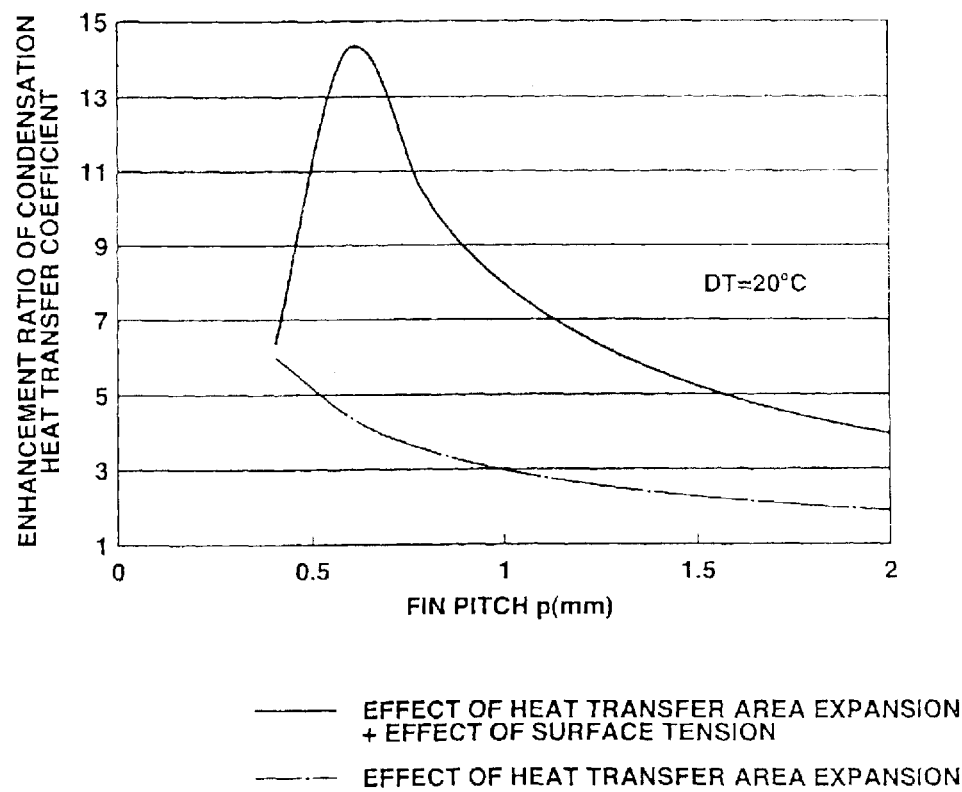
FIG. 4 is a diagram illustrating an effect by the low fins to accelerate the transfer of the heat of condensation.

FIG. 4 shows the effect, which is brought about by the low fins, of accelerating the condensation heat transfer coefficient when Fluorinert ® is used as a heat medium (condensate). As shown in FIG. 4, when a heat transfer temperature difference DT (a difference in temperature between a heat medium vapor and a heat transfer surface) is DT=20° C., a pitch p between fins is p=0.6 mm, and a fin height "h" is h=1 mm, then the low fins allow about 14 times larger condensation heat transfer coefficient as compared to that with flat plate.

The configuration of the thermoelectric module 10 shown in FIG. 2 is basically the same as that of the thermoelectric module 1 shown in FIGS. 1(a) and 1(b) except that the one-side electrodes 12 have the low fins 12F, 12F . . . . Thus, components constituting the thermoelectric module 10 in FIG. 2 that have the same functions as those of corresponding components in FIGS. 1(a) and 1(b) are shown with reference numerals gained by adding ten to each of reference numerals of such components shown in FIGS. 1(a) and 1(b), and the description thereof is omitted.

The thermoelectric module 10 having the above-described configuration can also achieve the same functions and effects as those given by the thermoelectric module 1 shown in FIGS. 1(a) and 1(b) in terms of the high heat release and absorption efficiencies and the prevention of thermal stress-caused damages, etc.

In the one-side electrode 12 of the above-described embodiment, the low fins 12F align with one another in the direction of the shorter edges of the electrodes and stand with interspaces thereamong in the direction of the longer edges of the electrodes.

In the above-described embodiment, each of the low fins 12F of the one-side electrodes 12 forms an elongate projection. However, the low fins 12F may also be formed by a group of pins.

It is also noted that the design of the low fins 2F of the one-side electrodes 12 should be determined so that optimum surface tension effect can be obtained by the determined pitch (space), height, shape or the like of the fins.

Figure 5A:
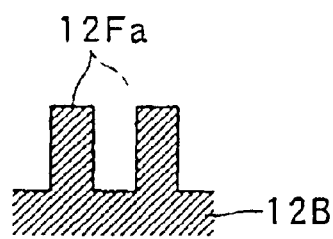
FIG. 5(a) is a partial cross-sectional view illustrating a modified example of the low fins of the thermoelectric module shown in FIG. 2.
Figure 5B:
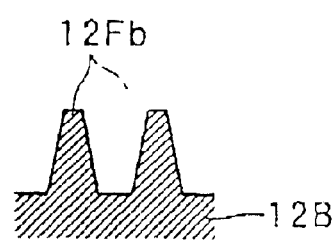
FIG. 5(b) is a partial cross-sectional view illustrating a modified example of the low fins of the thermoelectric module shown in FIG. 2.
Figure 5C:
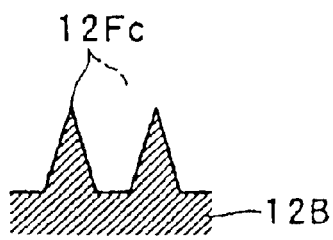
FIG. 5(c) is a partial cross-sectional view illustrating a modified example of the low fins of the thermoelectric module shown in FIG. 2.
Figure 5D:
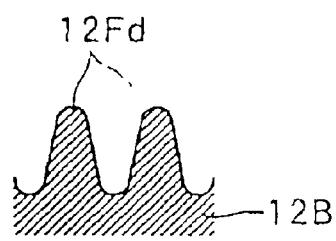
FIG. 5(d) is a partial cross-sectional view illustrating a modified example of the low fins of the thermoelectric module shown in FIG. 2.

It is also noted that the low fins 2F of the one-side electrodes 12 may have various shapes other than the shape of the low fin 12Fa shown in FIG. 5(a), such as a trapezoidal shape of a low fin 12Fb shown in FIG. 5(b), a triangular shape of a low fin 12Fc shown in FIG. 5(c), or a curved shape of a low fin 12Fd shown in FIG. 5(d).

Figure 6:
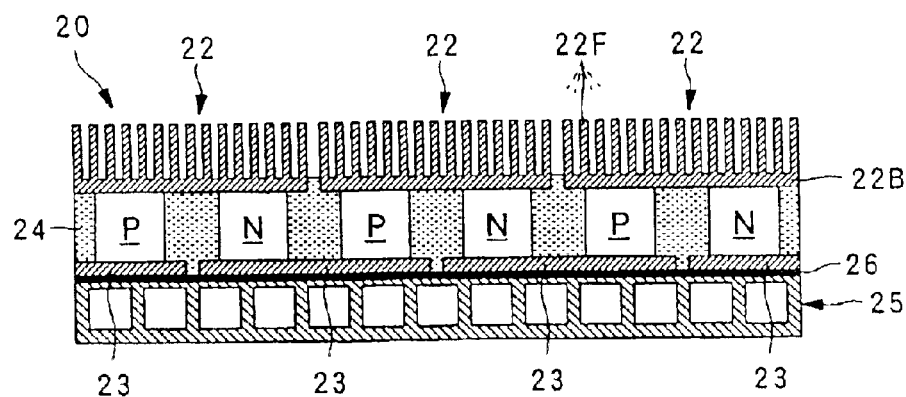
FIG. 6 is cross-sectional side view illustrating another embodiment of the thermoelectric module according to the present invention.

FIG. 6 shows another embodiment of the thermoelectric module according to the present invention. This thermoelectric module 20 is cooled by electrically conductive fluid such as water.

Each of other-side electrodes 23 is constructed by a rectangular flat plate which is connected to each of thermoelectric semiconductor elements P and N. The other-side electrodes 23, 23 . . . have, on the outer face thereof (lower face in FIG. 6), a water jacket 25 via an insulation layer 26 providing electrical insulation. The water jacket 25 allows electrically conductive fluid (e.g., water) to be supplied thereinto and circulated therethrough, and is formed of a metal material having high thermal conductivity such as copper (Cu) or aluminum (Al).

The above-described configuration of the thermoelectric module 20 is basically the same as that of the thermoelectric module 1 shown in FIGS. 1(a) and 1(b) except that the other-side electrodes 23, 23 . . . are constructed by flat plates and have the water jacket 25 via the insulation layer 26. Thus, components constituting the thermoelectric module 20 in FIG. 6 that have the same functions as those of corresponding components in FIGS. 1(a) and 1(b) are shown with reference numerals gained by adding twenty to each of reference numerals of such components shown in FIGS. 1(a) and 1(b), and the description thereof is omitted.

The thermoelectric module 20 having the above-described configuration can also achieve the same functions and effects as those given by the already-described thermoelectric modules 1 and 10, in terms of high heat release and heat absorption efficiencies and the prevention of thermal stress-caused damages, etc.

Figure 7:
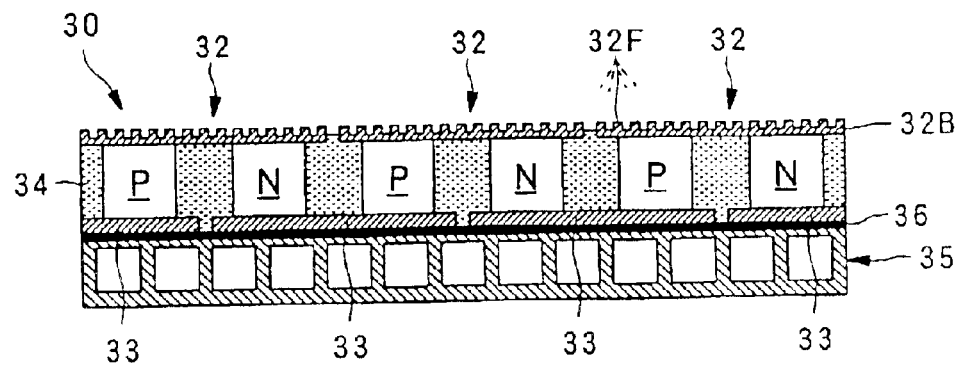
FIG. 7 is a cross-sectional side view illustrating another embodiment of the thermoelectric module according to the present invention.

FIG. 7 shows another embodiment of the thermoelectric module according to the present invention. This thermoelectric module 30 releases heat from a heat medium on the heat absorption side by means of condensation, and to be cooled by using electrically conductive fluid such as water.

Each of other-side electrodes 33 is constructed by a rectangular flat plate which is connected to each of thermoelectric semiconductor elements P and N. The other-side electrodes 33, 33 . . . has, on the outer face thereof (lower face in FIG. 7), a water jacket 35 via an insulation layer 36 providing electrical insulation. The water jacket 35 allows electrically conductive fluid (e.g., water) to be supplied thereinto and circulated therethrough, and is formed of a metal material having high thermal conductivity such as copper (Cu) or aluminum (Al).

The above-described configuration of the thermoelectric module 30 is basically the same as that of the thermoelectric module 10 shown in FIG. 2 except that each of the other-side electrodes 33, 33 . . . has a flat plate shape and the other-side electrodes 33, 33 . . . have the water jacket 35 via the insulation layer 36. Thus, components constituting the thermoelectric module 30 in FIG. 7 that have the same functions as those of corresponding components in FIG. 2 are show with reference numerals gained by adding twenty to each of reference numerals of such components shown in FIG. 2, and the description thereof is omitted.

The thermoelectric module 30 having the above-described configuration can also achieve the same functions and effects as those given by the already-described thermoelectric modules 1, 10, and 20 in terms of high heat release and heat absorption efficiencies and the prevention of thermal stress-caused damages, etc.

What is claimed is:

1. A thermoelectric module, which comprises:
    a plurality of thermoelectric semiconductor elements being arranged in a flat plate configuration and having one side face and another side face,
    a first side electrode directly connected to entirety of the one side face of the thermoelectric semiconductor elements,
    a second side electrode directly connected to entirety of the another side face of the thermoelectric semiconductor elements, at least one of the first side electrode and the second side electrode having a rectangular shape, and
    a multiplicity of heat transfer fins integrally formed on said at least one of the first side electrode and the second side electrode having the rectangular shape, so that the fins are parallel to a shorter side of the rectangular shape.

2. The thermoelectric apparatus according to claim 1, wherein at least one fin of the multiplicity of heat transfer fins is integrally formed on an interior portion of the rectangular shape of said at least one of the first side electrode and the second side electrode having the rectangular shape, so that the least one fin is spaced from the shorter sides of the rectangular shape.

3. A thermoelectric apparatus, which comprises:
    a thermoelectric module comprising a plurality of thermoelectric semiconductor elements being arranged in a flat plate configuration and having one side face and another side face, a first side electrode directly connected to all of the one side face of the thermoelectric semiconductor elements, a second side electrode directly connected to all of the another side face of the thermoelectric semiconductor elements, at least one of the first side electrode and the second side electrode having a shape of rectangular, and a multiplicity of heat transfer fins integrally formed on said at least one of the first side electrode and the second side electrode having the rectangular shape, so that the fins are parallel to a shorter side of the rectangular shape, and
    heat medium that condenses at the heat transfer fins of the thermoelectric module.

4. The thermoelectric apparatus according to claim 3, wherein at least one fin of the multiplicity of heat transfer fins is integrally formed on an interior portion of the rectangular shape of said at least one of the first side electrode and the second side electrode having the rectangular shape, so that the least one fin is spaced from the shorter sides of the rectangular shape.

5. A thermoelectric apparatus, which comprises:
    a thermoelectric module comprising a plurality of thermoelectric semiconductor elements being arranged in a flat plate configuration and having one side face and another side face, a first side electrode directly connected to all of the one side face of the thermoelectric semiconductor elements, a second side electrode directly connected to all of the another side face of the thermoelectric semiconductor elements, and a multiplicity of heat transfer fins integrally formed on at least one of the first side electrode and the second side electrode, and
    heat medium that condenses at the heat transfer fins of the thermoelectric module,
    wherein the heat transfer fins are of thin plate having a height of 5 mm or less and a pitch of 10 mm or less with adjacent fins being spaced apart by 5 mm or less.

* * * * *